(12) United States Patent
Lee et al.

(10) Patent No.: US 7,746,187 B2
(45) Date of Patent: Jun. 29, 2010

(54) SELF-CALIBRATING MODULATOR APPARATUSES AND METHODS

(75) Inventors: Wayne S. Lee, Santa Clara, CA (US); Akira Kato, Katano (JP); Toru Matsuura, Sakai (JP)

(73) Assignee: Panasonic Corporation, Osaka (JP)

( * ) Notice: Subject to any disclaimer, the term of this patent is extended or adjusted under 35 U.S.C. 154(b) by 135 days.

(21) Appl. No.: 12/131,417

(22) Filed: Jun. 2, 2008

(65) Prior Publication Data
US 2009/0295493 A1 Dec. 3, 2009

(51) Int. Cl.
*H03C 3/00* (2006.01)
(52) U.S. Cl. .......................................... 332/145; 331/44
(58) Field of Classification Search .................. 332/144, 332/145; 330/10; 331/14, 16–18, 23, 44
See application file for complete search history.

(56) References Cited

U.S. PATENT DOCUMENTS

| | | | |
|---|---|---|---|
| 5,243,302 A * | 9/1993 | Camp et al. .................... | 331/16 |
| 6,094,101 A | 7/2000 | Sander et al. | |
| 6,219,394 B1 | 4/2001 | Sander | |
| 7,015,738 B1 * | 3/2006 | Cao ............................. | 327/159 |
| 7,346,122 B1 * | 3/2008 | Cao ............................. | 375/296 |

OTHER PUBLICATIONS

Sander, W.B. et al., Polar Modulator for Multi-Mode Cell Phones, Custom Integrated Circuits Conference, 2003, Proceedings of the IEEE 2003, Sep. 21-24, 2003, pp. 439-445.

* cited by examiner

*Primary Examiner*—David Mis

(57) ABSTRACT

A self-calibrating modulator apparatus includes a modulator having a controlled oscillator and an oscillator gain calibration circuit. The oscillator gain calibration circuit includes an oscillator gain coefficient calculator configured to calculate a plurality of frequency dependent oscillator gain coefficients from results of measurements taken at the output of the controlled oscillator in response to a test pattern signal representing a plurality of different reference frequencies. The plurality of frequency dependent gain coefficients determined from the calibration process are stored in a look up table (LUT), where they are made available after the calibration process ends to scale a modulation signal applied to the modulator. By scaling the modulation signal prior to it being applied to the control input of the controlled oscillator, the nonlinear response of the controlled oscillator is countered and the modulation accuracy of the modulator is thereby improved.

25 Claims, 8 Drawing Sheets

US 7,746,187 B2

SELF-CALIBRATING MODULATOR APPARATUSES AND METHODS

FIELD OF THE INVENTION

The present invention relates to methods and apparatus for countering voltage controlled oscillator (VCO) nonlinearities in communication systems.

BACKGROUND OF THE INVENTION

A voltage controlled oscillator (or "VCO") is a type of electrical oscillator that generates an oscillatory signal having a frequency that is dependent on a control voltage. VCOs play an important role in communication systems and other electronic systems. They are used in both analog and digital applications, and are essential components of radio frequency communications systems.

FIG. 1 illustrates how a VCO is configured in a polar modulation transmitter 100. The polar modulation transmitter 100 comprises an amplitude modulator 102 in an amplitude modulation (AM) path, a VCO 104 in a phase modulation (PM) path, and a power amplifier (PA) 106. The amplitude modulator 102 functions to modulate a direct current power supply signal Vsupply according to amplitude variations in an amplitude modulation (AM) signal received in an AM path. The resulting amplitude modulated power supply signal is supplied to a power supply port of the PA 106. Meanwhile, a phase modulation (PM) signal received in the PM path is used as a tuning voltage, Vtune, which modulates the VCO 104 to generate a constant-amplitude phase modulated carrier signal. The PA 106 is typically implemented as a switched-mode PA operating in compression. Accordingly, as the constant-amplitude phase modulated carrier signal is amplified by the PA, the amplitude information contained in the amplitude modulated power supply signal is superimposed on the signal at the output of the PA 106.

Modulating the VCO 104 with the PM signal can be effective for some narrowband applications. However, as illustrated in FIG. 2, in wideband applications the VCO 104 is incapable of providing a linear response over the entire PM bandwidth. The nonlinear response results in distortion of the polar modulation transmitter output signal, making it difficult or impossible to comply with communications standards specifications. It would be desirable, therefore, to have methods and apparatus for avoiding or countering VCO nonlinearities in communication applications, including wideband polar modulation transmitter applications.

SUMMARY OF THE INVENTION

Self-calibrating methods and apparatuses for countering nonlinear effects of controlled oscillators are disclosed. An exemplary self-calibrating modulator apparatus includes a modulator having a controlled oscillator and an oscillator gain calibration circuit. The modulator is configured to receive either a test pattern signal or a modulation signal, depending on whether the self-calibrating modulator apparatus is configured to perform a calibration process or is configured for normal operation following execution of the calibration process. The test pattern signal is applied when the calibration process is being performed. The self-calibrating modulator apparatus includes circuitry that measures a plurality of measured output frequencies of the controlled oscillator for each of a plurality of different reference frequencies represented in the test pattern signal. The oscillator gain calibration circuit includes an oscillator gain coefficient calculator configured to calculate a plurality of frequency dependent oscillator gain coefficients from results of the measurements. To account for frequency drift of the controlled oscillator during measurement, a drift factor is optionally included in the calculation of the plurality of frequency dependent oscillator gain coefficients.

The frequency dependent oscillator gain coefficients determined from the calibration process are stored in a look up table (LUT). Following the calibration process, when the self-calibrating modulator apparatus is configured for normal operation, scaling circuitry is employed to scale (or "predistort") a modulation signal applied to the modulator by the frequency dependent oscillator gain coefficients stored in the LUT. By scaling the modulation signal prior to it being applied to the control input of the controlled oscillator, the frequency dependent nonlinear response of the controlled oscillator is countered and the modulation accuracy of the modulator is thereby improved. To increase the precision of the scaling, the oscillator gain calibration circuit includes an interpolation filter, which may be employed to determine additional oscillator gain coefficients from the frequency dependent oscillator gain coefficients stored in the LUT.

The self-calibrating methods and apparatuses of the present invention improve the modulation accuracy and performance of communications systems, particularly wideband communications systems. For example, according to one embodiment of the invention, the self-calibrating modulator apparatus is employed in the phase modulation path of a polar modulation transmitter, to improve the modulation accuracy of the transmitter. The self-calibrating methods and apparatuses of the present invention also allow lower-cost controlled oscillators to be used than would otherwise be required, since linearity design requirements and part-to-part performance variation restrictions can be relaxed. Finally, the calibration methods are performed in the field, thereby advantageously avoiding the tedium and expense characteristic of factory calibration.

Further features and advantages of the present invention, including a description of the structure and operation of the above-summarized and other exemplary embodiments of the invention, are described in detail below with respect to the accompanying drawings, brief descriptions of which are provided below. The same reference numbers are used in the drawings to refer to identical or functionally similar parts.

DETAILED DESCRIPTION

Figure 1:
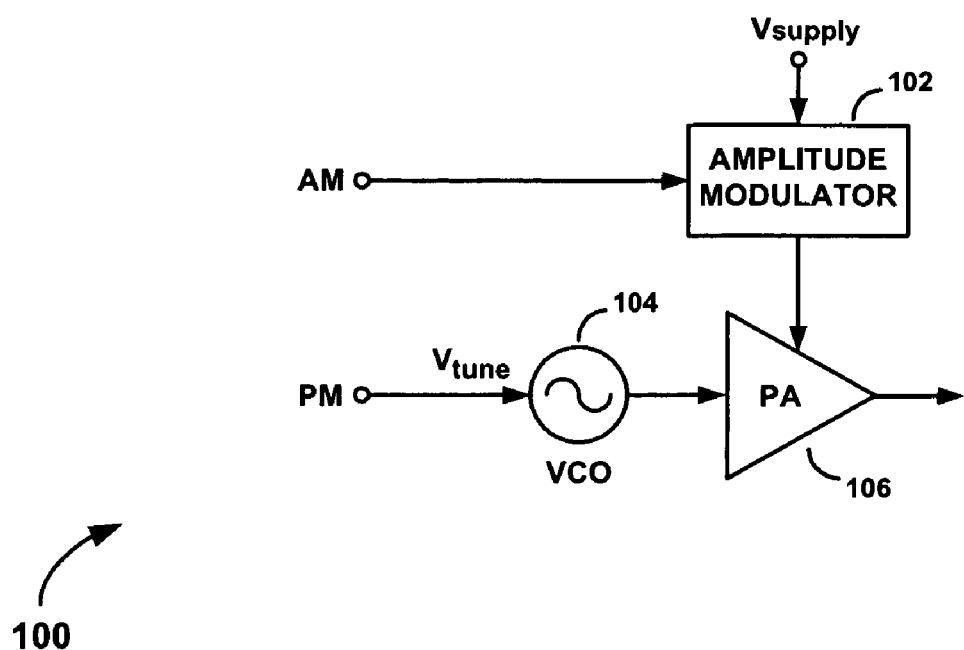
FIG. 1 is a drawing illustrating how a voltage controlled oscillator (VCO) is typically configured in the phase modulation (PM) path of a polar modulation transmitter.
Figure 2:
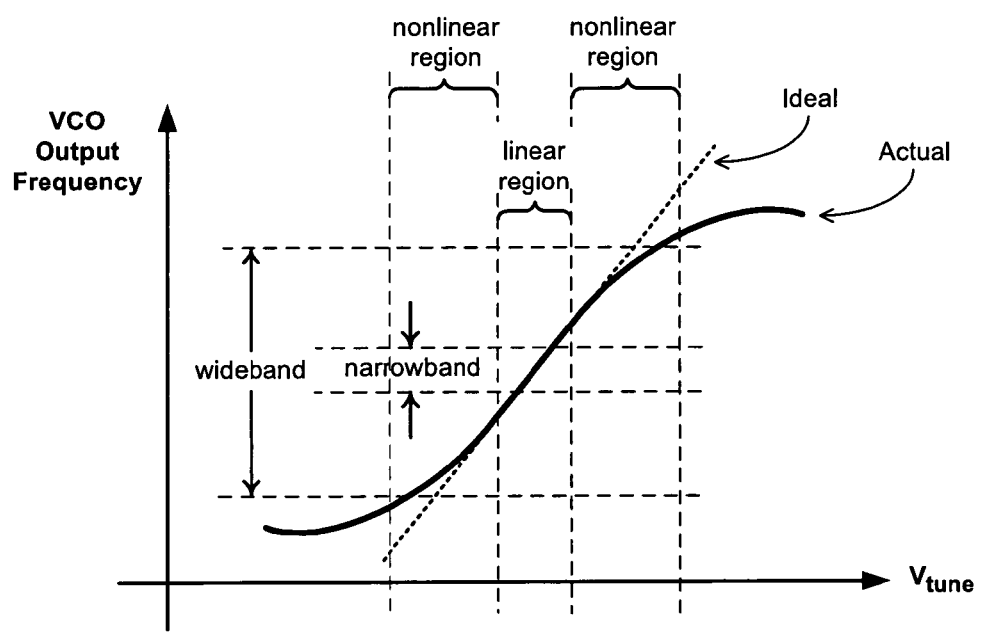
FIG. 2 is a graph of the output frequency of a VCO as a function of tuning voltage, Vtune, highlighting the VCO's nonlinear response when configured for use in a wideband application.
Figure 3:
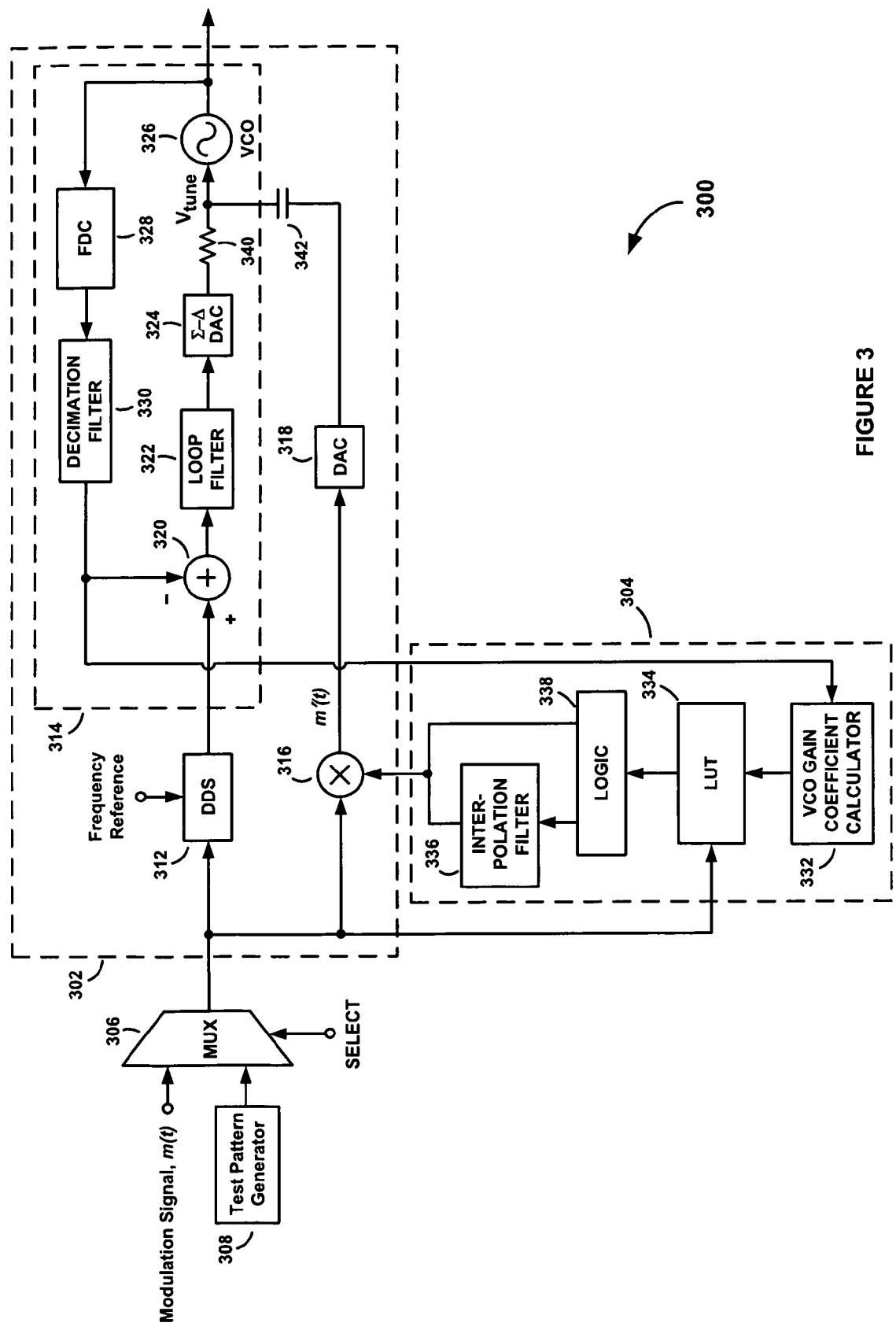
FIG. 3 is a drawing of a self-calibrating modulator apparatus, according to an embodiment of the present invention.

Referring to FIG. 3, there is shown a self-calibrating modulator apparatus 300, according to an embodiment of the present invention. The self-calibrating modulator apparatus 300 comprises a modulator 302, a voltage controlled oscillator (VCO) gain calibration circuit 304, and a multiplexer 306 for providing either a modulation signal m(t) or a test pattern signal from a test pattern generator 308 to the modulator 302. The modulator 302 includes a direct modulation path and a separate feed-forward path. A direct digital synthesizer (DDS) 312 and a frequency-locked loop (FLL) 314 are configured in the direct modulation path. A multiplier 316 and a digital to analog converter (DAC) 318 are configured in the feed-forward path. The FLL 314 comprises a summer 320, a digital loop filter 322, a sigma-delta ($\Sigma$-$\Delta$) DAC 324, a VCO 326, a frequency-to-digital converter (FDC) 328, and a decimation filter 330.

The VCO gain calibration circuit 304 comprises a VCO gain coefficient calculator 332, a look up table (LUT) 334, an interpolation filter 336, and logic circuitry 338. The VCO gain calibration circuit 304 is configured to perform a calibration process when the carrier frequency of the VCO 326 is being tuned, such as may occur, for example, when the modulator 302 is being powered up or is being tuned from one communications channel to another. During the calibration process, a test pattern signal is applied to the control input of the VCO 326 to measure frequency dependent nonlinearities of the VCO 326. Results from the measurements are used to calculate and store a plurality of frequency dependent VCO gain coefficients in the LUT 334. Once the calibration process has ended, the self-calibrating modulator apparatus 300 commences what will be referred to below as "normal operation". The calibration process and how the self-calibrating modulator apparatus 300 functions when configured for normal operation are described in detail below, starting with a description of details of the calibration process.

Figure 4:
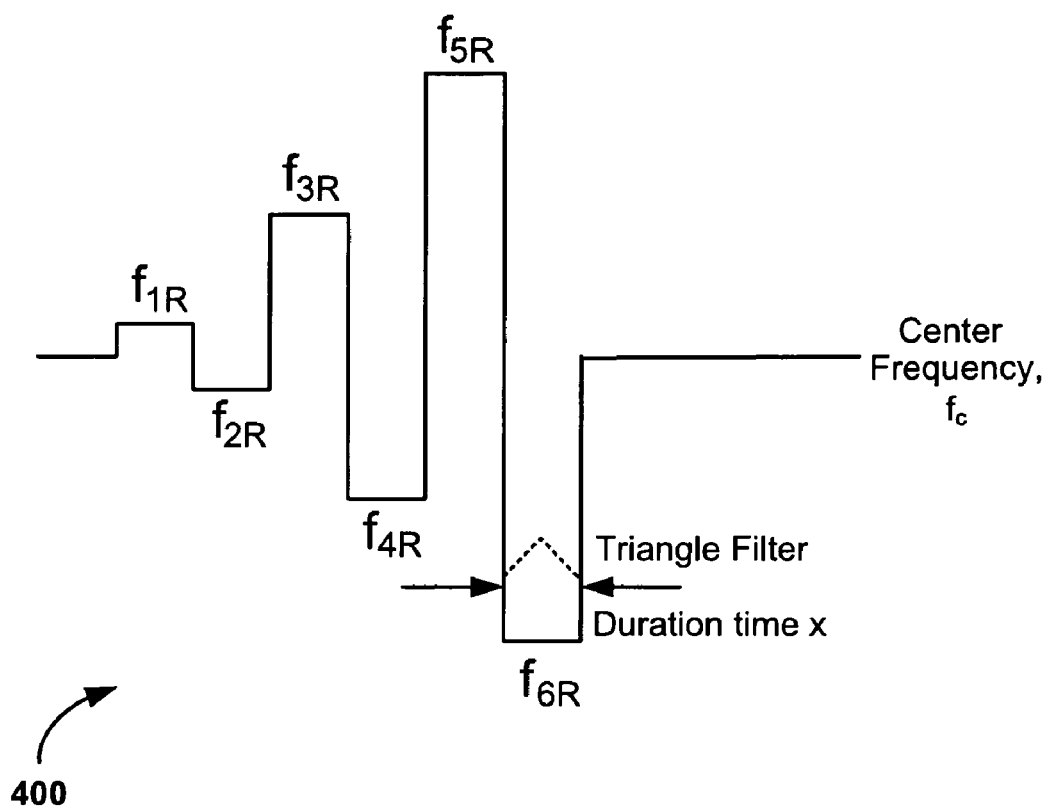
FIG. 4 is a drawing of an exemplary test pattern signal that may be used to calibrate the gain of the VCO of the self-calibrating modulator apparatus in FIG. 3.

FIG. 4 is a drawing of an exemplary test pattern signal 400 generated by the test pattern generator 308 and used to calibrate the gain of the VCO 326 of the self-calibrating modulator apparatus 300 in FIG. 3. The test pattern signal 400 comprises a sequence of digital signals, each of duration "x", representing a plurality of reference frequencies $f_{1R}$, $f_{2R}$, ..., $f_{6R}$. The digital signals are converted to analog reference frequency signals by the feed-forward path DAC 318 and then applied to the control input of the VCO 326, one after the other. As each reference frequency signal is applied, the output frequency of the VCO 326 is measured to calculate a VCO gain coefficient corresponding to the applied reference frequency. The time interval "x" during which each reference frequency is applied is set so that sufficient time is available to measure an average output frequency for each applied reference frequency. As explained in more detail below, the plurality of VCO gain coefficients calculated by application of the plurality of reference frequencies $f_{1R}$, $f_{2R}$, ..., $f_{6R}$ are used to scale (i.e., "predistort") a modulation signal applied to the modulator 302 during normal operation to counter the nonlinear response of the VCO 326.

According to one embodiment, the test pattern signal 400 is arranged so that consecutive pairs of reference frequencies (i.e., $f_{1R}$ and $f_{2R}$, $f_{3R}$ and $f_{4R}$, and $f_{5R}$ and $f_{6R}$) are symmetrical about a center frequency $f_c$. The first reference frequency in each pair is applied to the control input of the VCO 326 to push the output frequency of the VCO 326 above the center frequency $f_c$. A second reference frequency in each pair is applied to pull the output frequency of the VCO 326 below the center frequency by the same nominal amount. The symmetry of the reference frequency pairs about the center frequency $f_c$ allows drift-induced errors to be factored out in the VCO gain coefficient calculation process, as will be explained in more detail below. Each consecutive pair of reference frequencies also results in a greater frequency deviation from the center frequency $f_c$. By stepping the reference frequency deviations from a low frequency deviation to progressively higher frequency deviations, the potential for errors resulting from frequency drift of the VCO 326 are minimized.

According to one embodiment, the calibration process is performed during the final stage of a tuning process in which the center frequency $f_c$ (or carrier frequency) is tuned to its desired or required value. The number of reference frequencies used in the test pattern signal and the range of frequencies represented by all reference frequencies in the test pattern signal is determined by the degree of gain correction precision required or desired, the modulation bandwidth of the modulation applied to the input of the VCO 326 during normal operation, and/or the time available or allotted to complete the calibration process during the final stage of the tuning process. The test pattern signal 400 shown in FIG. 4 comprises a "six-point" test pattern signal representing six different reference frequencies, $f_{1R}$, $f_{2R}$, ..., $f_{6R}$. The six different reference frequencies, $f_{1R}$, $f_{2R}$, ..., $f_{6R}$ allow six different VCO gain coefficients to be calculated. Such a test pattern has shown to be suitable for calibrating the gain of the VCO 326 over a modulation bandwidth used in wideband code division multiple access (W-CDMA) cellular communications applications. Other multi-point test pattern signals having more or less than six points may be used, depending on the degree of correction precision required and the modulation bandwidth applied to the VCO 326 during normal operation, as will be appreciated by those of ordinary skill in the art.

Figure 5:
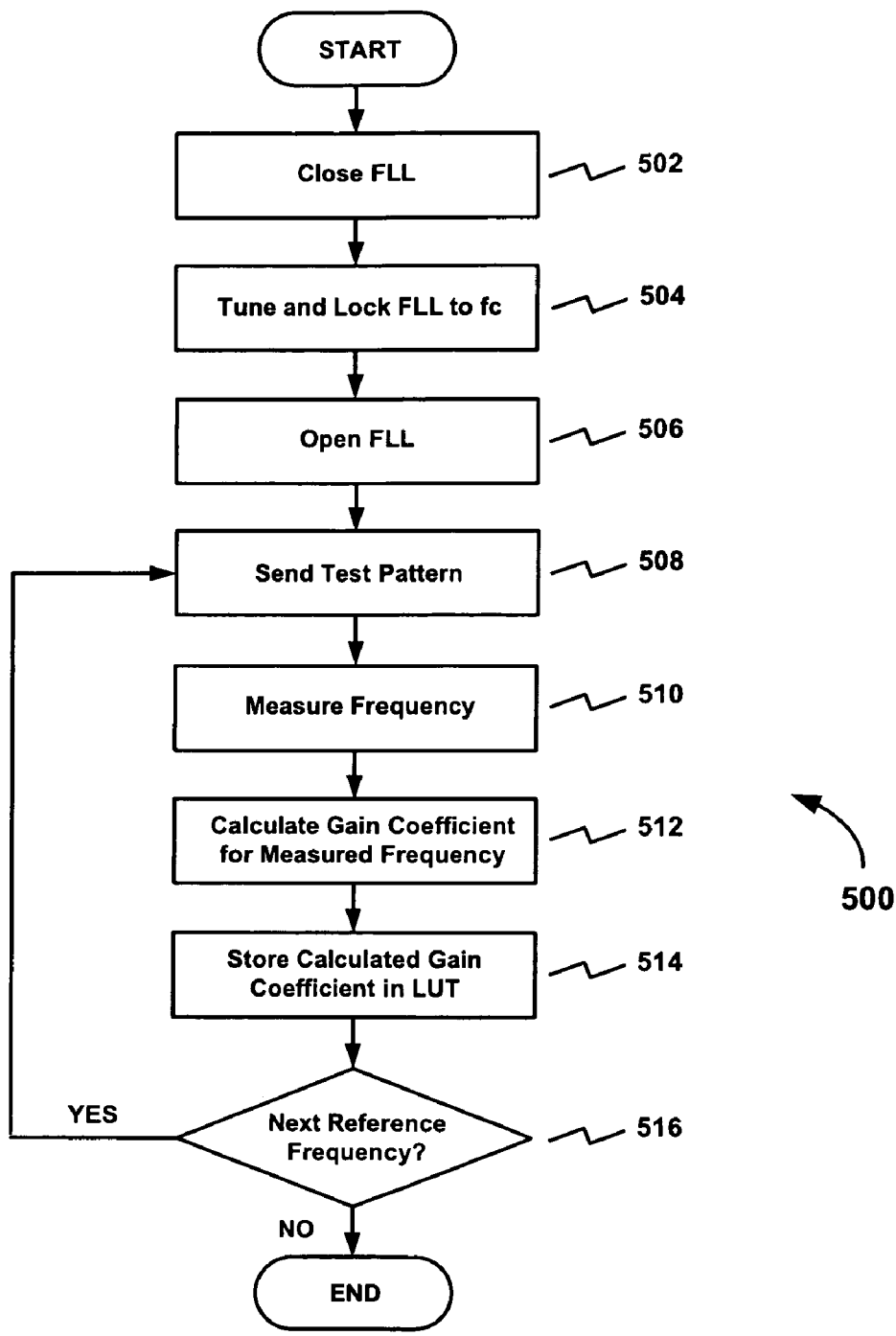
FIG. 5 is a flow chart illustrating an exemplary calibration process performed by the self-calibrating modulator apparatus in FIG. 3, according to an embodiment of the present invention.

FIG. 5 is a flow chart illustrating an exemplary calibration process 500 performed by the self-calibrating modulator apparatus 300, according to an embodiment of the present invention. In a first step 502 the loop of the FLL 314 is closed. Next, at step 504 the control input of the VCO 326 is biased so that the FLL 314 tunes and locks to a center frequency $f_c$ centered in a frequency band of interest.

After the FLL 314 is tuned and locked to the center frequency $f_c$, at step 506 the FLL 314 loop is opened, by, for example, holding the tuning voltage Vtune constant. The purpose of opening the FLL 314 loop is to prevent the closed loop feedback action of the FLL 314 from attempting to cancel out the test pattern signal applied in the next step.

At step 508 the SELECT input of the multiplexer is set so that the digital signal representing the first reference frequency $f_{1R}$ in the first time interval of the test pattern signal is coupled to the DAC 318 in the feed-forward path of the modulator 302. The multiplier 316 is effectively bypassed during the calibration process, as it is not used to scale the test pattern signal. The analog reference frequency signal generated by the DAC 318 is applied to the control input of the VCO 326.

At step 510 the output frequency of the VCO 326 is measured by the FDC 328 and the decimation filter 330. Specifically, the FDC 328 digitizes the output signal of the VCO 326, and the decimation filter 330 filters the digitized result to provide a digital signal representing a measured average output frequency $f_{1M}$. According to one embodiment, the decimation filter 330 is implemented as a finite impulse response (FIR) filter having a triangular weighting function. Other types of averaging filters, such as boxcar or Gaussian type filters can alternatively be used, as will be readily understood by those of ordinary skill in the art. An FIR filter having a triangular weighting function and an example of one type of FDC that may be used to implement the FDC 328 of the FLL 314, are shown and described in U.S. Pat. No. 6,219,394, which is hereby incorporated herein by reference.

At step 512 the measured average output frequency $f_{1M}$ is used by the VCO gain coefficient calculator 332 to calculate a VCO gain coefficient G1 corresponding to the first reference frequency $f_{1R}$. According to an exemplary embodiment, the gain coefficient is calculated using the following formula: $G1=[(f_{1R}-f_c)/(f_{1M}-f_c)]*G$, where $f_c$ is the center frequency around which the VCO 326 is being calibrated and G is the nominal gain of the VCO 326 at the center frequency $f_c$.

At step 514 the calculated gain coefficient G1 for the first reference frequency $f_{1R}$ is stored in the VCO gain coefficient LUT 334, where it is later made available to the multiplier 316 in the feed-forward path of the modulator 302 during normal operation after the calibration process 500 has been completed.

At decision 516 it is determined whether the gain of the VCO 326 is to be calibrated for a next reference frequency. If "yes," steps 508 through 514 are repeated for the next reference frequency in the test pattern signal, i.e., for second reference frequency $f_{2R}$. Steps 508 through 516 are repeated until VCO gain coefficients for all reference frequencies have been calculated and stored in the LUT 334, upon which the result of the decision at step 516 is "no" and the method 500 ends.

Once the calibration process has completed, the loop of the FLL 314 is closed and the self-calibrating modulator apparatus 300 commences normal operation. In normal operation, the SELECT input to the multiplexer is set so that a modulation signal m(t) is coupled to the DDS 312, instead of the test pattern signal. The DDS 312 functions to generate a first digital stream representing the desired output frequency of the VCO 326 from the modulation signal m(t), relative to a frequency reference (e.g., the center frequency $f_c$ of a communications channel) represented in a digital frequency reference signal.

The first digital stream is fed to a first input of the summer 320, while a second digital stream at the output of the decimation filter 330 is fed to a second input of the summer 320. The second digital stream represents the actual output frequency of the modulated signal appearing at the output of the VCO 326, and is generated by the FDC 328 and the decimation filter 330. In particular, the FDC 328 operates to digitize the output signal of the VCO 326, and the decimation filter 330 operates to decimate the digitized result down to the digital loop clock rate of the FLL 314.

The summer 320 adds the inverse of the second digital stream to the first digital stream, to generate an error signal representing the difference in the frequency of the modulated signal appearing at the output of the VCO and the desired frequency represented in the first digital stream. When the frequency of the modulated signal is at the desired output frequency, the first and second digital streams have, on average, the same density of logic "1s" relative to logic "0s" and the error signal at the output of the summer 320 represents zero error. However, whenever the average values differ, the error represented by the error signal is nonzero.

The error signal is filtered by the digital loop filter 322 and converted to an analog error signal by the $\Sigma$-$\Delta$ DAC 324. The analog error signal is coupled to an analog integrator formed, for example, by a resistor 340 and a capacitor 342. The resulting filtered signal is used to control the output frequency of the VCO 326 so that it moves in the direction of the desired output frequency.

During the calibration process described above, the feed-forward path serves as a path for introducing a test pattern signal to the control input of the VCO 326. When the self-calibrating modulator apparatus 300 is configured for normal operation, the feed-forward path serves as both an auxiliary modulation path to the VCO 326 and a path for scaling the modulation signal m(t). The modulation signal m(t) is fed forward along the feed-forward path to the multiplier 316, which operates to scale the modulation signal m(t) by the VCO gain coefficients stored in the LUT 334 in order to counter the nonlinear response of the VCO 326. The VCO gain coefficients are indexed according to frequency, so that as the frequency represented in the modulation signal m(t) changes over time the appropriate gain coefficients are rapidly accessed and retrieved from the LUT 334 and applied to the multiplier 316 to scale the modulation signal m(t).

The resulting scaled modulation signal m'(t) is converted to an analog signal by the DAC 318 and then combined with the direct modulation signal in the direct modulation path, via the analog filter capacitor 342, at the control input of the VCO 326, thereby correcting for the nonlinear response of the VCO 326.

Employing the feed-forward path as an auxiliary modulation path during normal operation allows the modulation bandwidth of the modulator 302 to be increased without being affected by loop bandwidth constraints of the FLL 314. This affords the ability to employ the self-calibrating modulator apparatus 300 in wideband communications applications.

Figure 6:
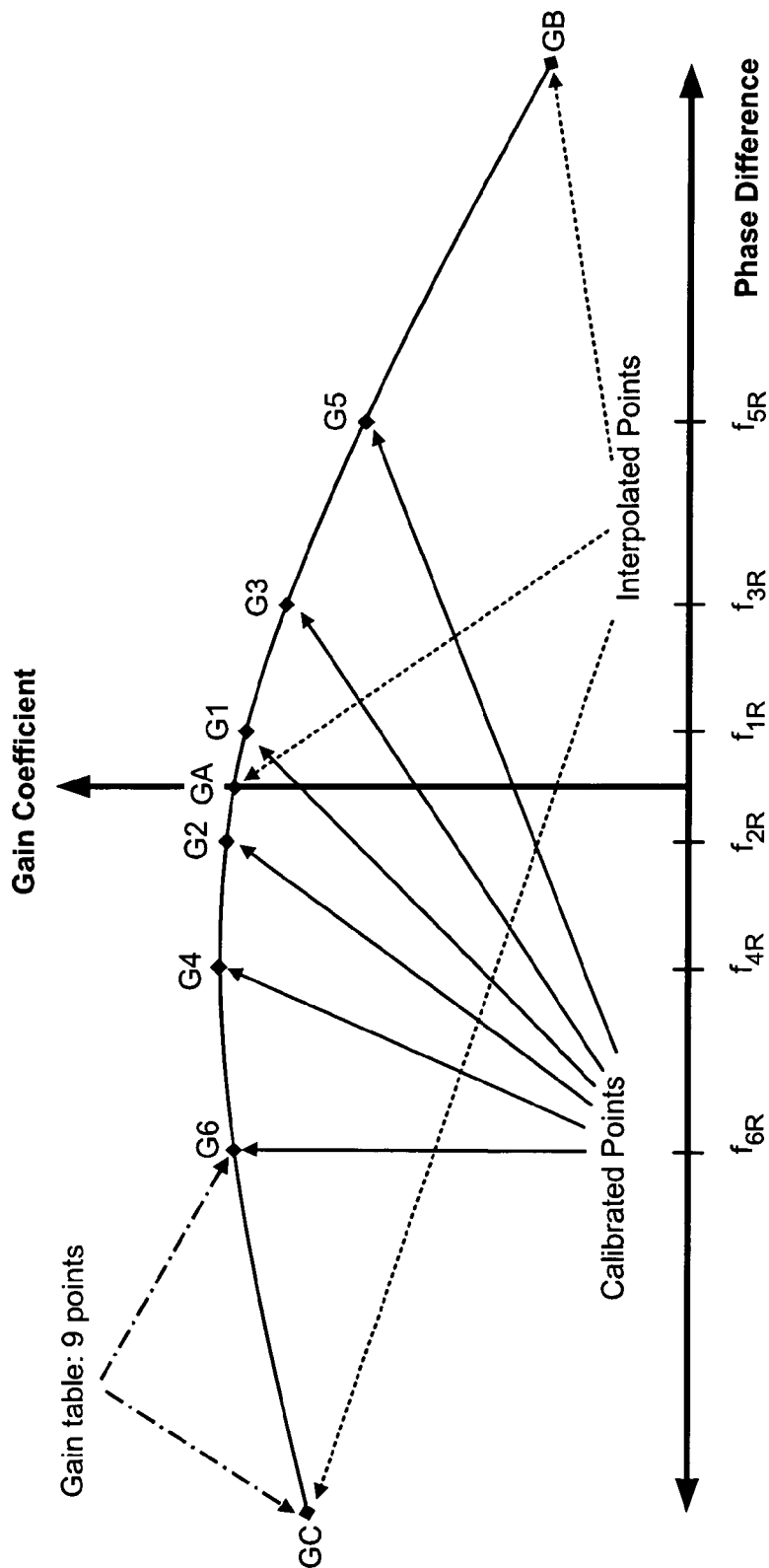
FIG. 6 is a VCO gain table diagram including a set of VCO gain coefficients G1, G2, . . . , G6 calculated and stored in the look up table (LUT) of the VCO gain calibration circuit during calibration, and interpolated VCO gain coefficients GA, GB and GC calculated by an interpolation filter from two or more of the stored VCO gain coefficients G1, G2, ..., G6 during normal operation, according to one aspect of the invention.

According to another aspect of the invention, an interpolation filter 336 may be employed during normal operation to generate additional VCO gain coefficients from the VCO gain coefficients stored in the LUT 334. The logic circuitry 338 functions to determine whether the frequency represented in the modulation signal m(t) falls between entries in the LUT 334. If it does, the interpolation filter 336 operates to calculate an additional VCO gain coefficient from two or more gain coefficients stored in the LUT 334. FIG. 6 illustrates, for example, how additional VCO gain coefficients GA, GB and GC can be determined by interpolating from among a set of nine gain coefficients (G1, . . . , G9) stored in the LUT 334. Once an interpolated gain coefficient has been calculated for a particular frequency, the interpolated gain coefficient is coupled to the multiplier 316 to scale the modulation signal m(t) at that frequency.

The ability to interpolate VCO gain coefficients reduces the number of VCO gain coefficients that need to be calculated and stored in the LUT 334 during the calibration process, thereby reducing the overall time required to complete the calibration process. Interpolating VCO gain coefficients can also be used to increase the precision and accuracy of the VCO gain correction applied during normal operation. Finally, the logic circuitry 338 may further include logic to bypass the interpolation filter 336, if for some reason the extra level of correction precision provided by the interpolation filter 336 is not required or desired.

Figure 7:
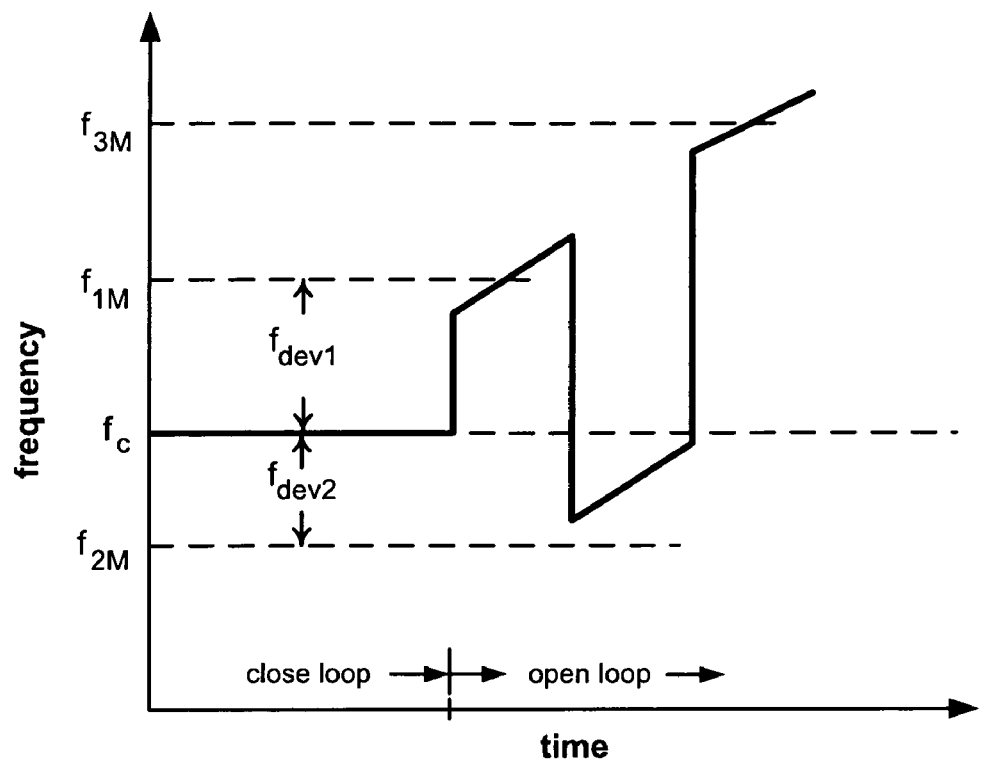
FIG. 7 is a diagram illustrating how the output frequency of the VCO of the self-calibrating modulator apparatus in FIG. 3 can drift during the calibration process due to operating the VCO open-loop.

As discussed above, the calibration process of the self-calibrating modulator apparatus 300 is performed with the FFL 314 loop open. When the loop is closed, the feedback action of the FLL 314 operates to prevent the average output frequency of the VCO 326 from drifting too far away from the desired output frequency. However, when the loop is opened to perform the calibration process, the feedback action of the loop is no longer available to counter frequency drift. Consequently, as illustrated in FIG. 7, frequency drift can occur as the calibration process is being performed. If the frequency drift is excessive, the calculations of the VCO gain coefficients in the calibration process can be inaccurate.

To prevent frequency-drift-induced errors, the VCO gain coefficient formula used above can be modified to account for frequency drift. Specifically, instead of using the VCO gain coefficient formula $Gn=[(f_{nR}-f_c)/(f_{nM}-f_c)]*G=(reference/measured)*G$, where n=1, 2, etc., a VCO gain coefficient formula including a drift reduction factor is used, i.e.: $Gn'=[reference/(measured-(2*(n-1)+1)*drift)]*G$ (for n=1, 3, ..., etc.; odd) and $Gn'=[reference/(measured+(2*(n-1)+1)*drift)]*G$ (for n=2, 4, ..., etc.; even). For the two-point calibration example illustrated in FIG. 7, where it is assumed that the drift is linear, the drift reduction factor is equal to: $drift=[(f_{1M}+f_{2M})/2-f_c]/2=(f_{dev1}-f_{dev2})/4$, where $f_{dev1}=f_{1M}-f_c$ is the frequency deviation of the first measured frequency $f_{1M}$ from the center frequency $f_c$, and $f_{dev2}=f_c-f_{2M}$ is the frequency deviation of the second measured frequency $f_{2M}$ from the center frequency $f_c$.

Figure 8:
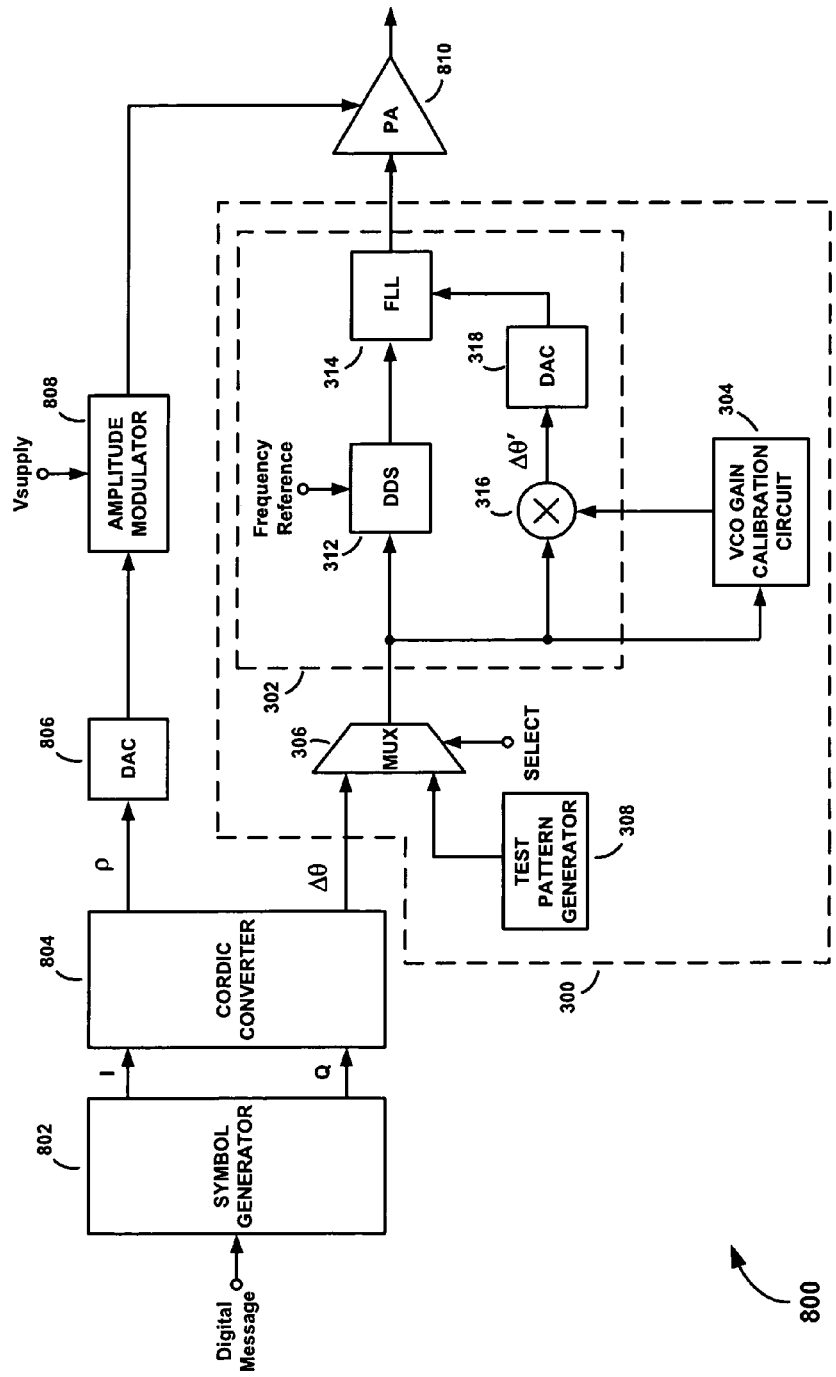
FIG. 8 is a drawing of a polar modulation transmitter adapted to include the self-calibrating modulator apparatus in FIG. 3, according to an embodiment of the present invention.

The self-calibrating modulator apparatus 300 may be employed in a variety of different modulation applications, including wideband modulation applications. FIG. 8 illustrates, for example, how it may be employed as a phase modulator in the phase modulation path of a polar modulation transmitter 800. The polar modulation transmitter 800 comprises a symbol generator 802; a rectangular-to-polar converter, such as a CORDIC (COordinate Rotation DIgital Computer) 804; an amplitude modulation (AM) path including an AM path DAC 806 and an amplitude modulator 808; a phase modulation path (PM) including the self-calibrating modulator apparatus 300; and a power amplifier (PA) 810.

The symbol generator 802 functions to group bits of a digital message to be transmitted into in-phase (I) and quadrature phase (Q) sequences of symbols formatted according to an applicable modulation scheme. The CORDIC converter 804 functions to generate a digital amplitude modulation signal ρ and a digital phase difference modulation signal Δθ from the rectangular-coordinate I and Q sequences of symbols. The AM path DAC 806 converts the digital amplitude modulation signal p into an analog amplitude modulation signal. The analog amplitude modulation signal is used by the amplitude modulator 808 to amplitude modulate a direct current (DC) power supply signal, Vsupply. The resulting amplitude modulated power supply signal is coupled to a power supply port of the PA 810.

When configured in the PM path of the polar modulation transmitter 800, the self-calibrating modulator apparatus 300 is configurable to determine frequency dependent VCO gain coefficients by performing a calibration process. The calibration process is substantially similar to the calibration process 500 described above in connection with FIG. 5, so will not be described again here.

Following the calibration process, the stored VCO gain coefficients are made available to the modulator 302 as the polar modulation transmitter 800 operates. The VCO gain coefficients are retrieved from the LUT based on the frequency represented in the phase difference modulation signal Δθ and used to scale the phase difference modulation signal Δθ. The resulting scaled phase difference modulation signal Δθ' is injected into the FLL 314 at the control input of the VCO 326. As the VCO 326 is modulated by the modulation signals from the direct and feed-forward modulation paths, it accumulates (i.e., integrates) the phase of the signal to generate a phase modulated carrier centered at the center frequency $f_c$. The phase modulated carrier signal is coupled to the input of the PA 810, which is implemented as highly-efficient nonlinear PA, such as a Class D, E or F switch-mode PA configured to operate in compression. As the PA 810 amplifies the phase modulated carrier signal, the amplitude information in the amplitude modulated supply signal is superimposed on the output signal of the PA 810.

Although the present invention has been described with reference to specific embodiments thereof, these embodiments are merely illustrative and exemplary, and are not meant to restrict the invention in any way. Further, various modifications or changes to the specifically disclosed embodiments of the invention will be suggested to those of ordinary skill in the art, and, therefore should be included within the scope of the invention as it defined by the appended claims.

What is claimed is:

1. A self-calibrating modulator apparatus, comprising:
   a modulator having a direct modulation path, a feed-forward path, and a controlled oscillator having a control input configured to receive signals from the direct modulation path and the feed-forward path; and
   an oscillator gain calibration circuit coupled to the feed-forward path of said modulator operable to determine a plurality of frequency dependent oscillator gain coefficients used to counter nonlinear effects of said controlled oscillator,
   wherein said direct modulation path and said feed-forward path receive a modulation signal.

2. The self-calibrating modulator apparatus of claim 1, further comprising a test pattern generator configured to generate a test pattern signal for the feed-forward path of said modulator, said test pattern signal representing a plurality of different reference frequencies.

3. The self-calibrating modulator apparatus of claim 2, further comprising circuitry configured to measure a plurality of output frequencies of the controlled oscillator for each of the different reference frequencies represented in said test pattern signal.

4. The self-calibrating modulator apparatus of claim 3 wherein said oscillator gain calibration circuit includes an oscillator gain coefficient calculator configured to calculate a plurality of frequency dependent oscillator gain coefficients from said plurality of measured output frequencies.

5. The self-calibration modulator apparatus of claim 4, further comprising a look up table (LUT) configured to store said plurality of frequency dependent oscillator gain coefficients.

6. The self-calibration modulator apparatus of claim 5 wherein said feed-forward path includes a multiplier operable to scale said modulation signal received in said feed-forward path by the frequency dependent oscillator gain coefficients stored in said LUT to counter frequency dependent nonlinearities of said controlled oscillator.

7. The self-calibration modulator apparatus of claim 6, further comprising an interpolation filter configured to interpolate additional oscillator gain coefficients from two or more of the plurality of frequency dependent oscillator gain coefficients stored in said LUT.

8. The self-calibration modulator apparatus of claim 2 wherein the plurality of different reference frequencies represented in said test pattern signal includes frequencies that cause the output frequency of said controlled oscillator to symmetrically deviate above and below a center frequency.

9. The self-calibration modulator apparatus of claim 2 wherein the reference frequencies represented in said test pattern signal are configured so that the output frequency of the controlled oscillator increases from a low frequency deviation from the center frequency to progressively larger frequency deviations from a center frequency.

10. The self-calibrating modulator apparatus of claim 4 wherein said oscillator gain calibration circuit is further configured to factor out effects of frequency drift of the controlled oscillator in calculating the plurality of frequency dependent oscillator gain coefficients.

11. A method of countering nonlinearities of a controlled oscillator, comprising:
configuring a controlled oscillator in a closed-loop frequency control circuit of a modulator apparatus;
tuning and locking said frequency control circuit to cause an output frequency of said controlled oscillator to be centered at a center frequency;
opening a loop of the frequency control circuit;
applying a test pattern signal to a control input of said controlled oscillator, said test pattern signal representing a plurality of reference frequencies that cause the output frequency of the controlled oscillator to deviate from said center frequency;
measuring a plurality of output frequencies of the controlled oscillator for each reference frequency represented in the test pattern signal; and
calculating a plurality of oscillator gain coefficients from said plurality of measured output frequencies.

12. The method of claim 11, further comprising storing said plurality of oscillator gain coefficients in a look up table (LUT).

13. The method of claim 11, further comprising scaling a modulation signal applied to the modulator apparatus by one or more oscillator gain coefficients of said plurality of oscillator gain coefficients, and applying the resulting scaled modulation signal to the control input of the controlled oscillator.

14. The method of claim 12, further comprising interpolating additional oscillator gain coefficients from two or more oscillator gain coefficients of said plurality of oscillator gain coefficients.

15. The method of claim 11 wherein calculating the plurality of oscillator gain coefficients from said plurality of measured output frequencies includes factoring out effects of frequency drift caused by measuring the plurality of measured output frequencies open-loop.

16. The method of claim 11 wherein the plurality of reference frequencies comprise one or more pairs of reference frequencies that are symmetrical about the center frequency and which cause the controlled oscillator output frequency to deviate above and below the center frequency.

17. The method of claim 16 wherein each consecutive pair of reference frequencies results in a greater frequency deviation of the controlled oscillator output frequency from the center frequency $f_c$.

18. A polar modulation transmitter, comprising:
an amplitude modulation path having an amplitude modulator configured to amplitude modulate a direct current power supply signal according to amplitude variations in an amplitude modulation signal received in the amplitude modulation path;
a phase modulation path including a self-calibrating modulator apparatus having a phase modulator having a direct modulation path, a feed-forward path, and a controlled oscillator having a control input configured to receive signals from the direct modulation path and the feed-forward path and an oscillator gain calibration circuit coupled to the feed-forward path of said phase modulator, said self-calibrating modulator apparatus operable to calculate frequency dependent oscillator gain coefficients for use by said phase modulator to counter nonlinear frequency responses of said controlled oscillator; and
a power amplifier configured to amplify a phase modulated carrier signal generated by said phase modulator according to an amplitude modulated power supply signal applied to a power setting input of said power amplifier from said amplitude modulator,
wherein said direct modulation path and said feed-forward path receive a modulation signal.

19. The polar modulation transmitter of claim 18 wherein said phase modulator is configurable to receive said modulation signal or a test pattern signal, depending on whether said self-calibrating modulator apparatus is performing a calibration process.

20. The polar modulation transmitter of claim 19 wherein said feed-forward path serves as a means for introducing the test pattern signal to a control input of the VCO when the self-calibrating modulator apparatus is performing said calibration process.

21. The polar modulation transmitter of claim 20 wherein after the calibration process has completed the feed-forward path serves as path for scaling the modulation signal by the frequency dependent oscillator gain coefficients and as an auxiliary modulation path for coupling the resulting scaled modulation signal to the control input of the controlled oscillator.

22. The polar modulation transmitter of claim 18 wherein said self-calibrating modulator apparatus includes circuitry configured to measure a plurality of output frequencies of said controlled oscillator in response to a test signal pattern representing a plurality of different reference frequencies.

23. The polar modulation transmitter of claim 22 wherein said self-calibrating modulator apparatus includes an oscillator gain coefficient calculator configured to calculate said frequency dependent oscillator gain coefficients based on said plurality of measured output frequencies.

24. The polar modulation transmitter of claim 23 wherein said self-calibrating modulator apparatus includes a look up table (LUT) configured to store said frequency dependent oscillator gain coefficients.

25. The polar modulation transmitter of claim 24 wherein said self-calibrating modulator apparatus includes an interpolation filter operable to determine additional oscillator gain coefficients from the oscillator gain coefficients stored in said LUT.

* * * * *